United States Patent
Matsuzawa

(10) Patent No.: US 6,505,329 B1
(45) Date of Patent: Jan. 7, 2003

(54) SEMICONDUCTOR DEVICE DESIGNING METHOD AND APPARATUS, AND MEMORY MEDIUM THAT IS STORED WITH MACRO INFORMATION

(75) Inventor: Masao Matsuzawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/579,303

(22) Filed: May 25, 2000

(30) Foreign Application Priority Data

May 31, 1999 (JP) .......................................... 11-153057

(51) Int. Cl.[7] .............................................. G06F 17/50
(52) U.S. Cl. ............................................. 716/8; 716/11
(58) Field of Search ................................ 716/8–14, 16, 716/1–2, 19–21

(56) References Cited

U.S. PATENT DOCUMENTS

| | | | | |
|---|---|---|---|---|
| 4,768,016 A | * | 8/1988 | Chu et al. .................... | 341/159 |
| 5,883,814 A | * | 3/1999 | Luk et al. ....................... | 716/2 |
| 6,130,552 A | * | 10/2000 | Jefferson et al. .............. | 326/38 |
| 6,263,479 B1 | * | 7/2001 | Tajima ......................... | 716/11 |

FOREIGN PATENT DOCUMENTS

| | | |
|---|---|---|
| JP | 62-101047 | 5/1987 |
| JP | 4-176162 | 6/1992 |
| JP | 5-47973 | 2/1993 |
| JP | 9-162661 | 6/1997 |
| JP | 10-261718 | 9/1998 |

* cited by examiner

Primary Examiner—Matthew Smith
Assistant Examiner—Paul Dinh
(74) Attorney, Agent, or Firm—Scully, Scott, Murphy & Presser

(57) ABSTRACT

According to a semiconductor device designing method of the present invention, a single-chip microprocessor with an A/D (analog-to-digital) converter is designed and laid out using a hard macro of the main body of the A/D converter (A) with address-fixed pads and a soft macro of the analog signal input circuit (B). The main body of the A/D converter is made up of fixed address pads ($a_2$ to $a_4$), a reference voltage generator b3, and a comparison/con version circuit b4, whereas the analog signal input circuit (B) is made up of multiple input circuits (Ch0 to Ch11), each being made up of a protection circuit $b_5$, a switch, and a piece of magnetic field shielding material. Each of the input circuits (Ch0 to Ch11) is represented by a hard macro. The soft macro includes interconnective information among the input circuits (Ch0 to Ch11). The layout of the hard macro including the pads ($a_2$ to $a_4$) and the main body of the A/D converter ($a_1$) is first fixed. Then each input circuit (Ch0 to Ch11) is laid out near corresponding pads ($a_5$ to $a_{16}$).

15 Claims, 10 Drawing Sheets

SEMICONDUCTOR DEVICE DESIGNING METHOD AND APPARATUS, AND MEMORY MEDIUM THAT IS STORED WITH MACRO INFORMATION

BACKGROUND OF THE INVENTION

1. Field of the Invention

The present invention relates to a semiconductor device designing method and apparatus as well as a memory media that is stored with macro information, which is used to design a semiconductor device. In particular, it relates to techniques for designing differing sizes of semiconductor devices by combining macros.

2. Description of the Related Arts

Japanese Patent Laid-open No. Hei 10-261718 describes an ASIC (application specific integrated circuit), which is a type of semiconductor device. More specifically it describes a technique of designing an ASIC by laying out macro cells of varying types of circuits, such as a CPU core, a RAM, and a ROM, on a semiconductor chip, and then interconnecting them.

FIG. 1 is a flowchart that shows a general design procedure of a macro-based semiconductor device. As shown in this Figure, in step S1 the specifications of functions and characteristics of a to-be-developed semiconductor device are planned. Afterwards, small-scale circuit blocks necessary for satisfying these specifications are planned, and then registered as macros in a library. In step S2 some of these small-scale macros are combined so as to design a larger-scale functional block and then register it in the said library. Next in step S3, these small-scale and larger-scale macros along with circuit elements, input/output terminals, etc. are then arranged in predetermined areas, respectively, thus determining their rough layout on the semiconductor chip.

There exists a hard macro and a soft macro. In each hard macro, the layout of the circuit elements and interconnects, which make up each macro and which connect them as necessary, are fixed on the semiconductor chip. Conversely, the soft macro does not fix the layout of its circuit elements like the hard macro does, but fixes the relatively connective relationship among circuit elements, which is represented by a netlist, etc. or a functional level description. In the conventional semiconductor device plan, each circuit is formed into either a hard macro or a soft macro, and as a result the semiconductor devices are designed in a hierarchic fashion such that small-scale macros are combined to form large-scale macros and the floor plan is determined based upon these types of macros.

Next, the chip size of the semiconductor device made necessary by this floor plan is determined in step S4. The package that can accommodate the semiconductor chip with this chip size is determined in step S5. Then in step S6 the intervals between respective adjacent pads that will be placed on the semiconductor chip are determined based upon this chip size and package. Next, once the intervals between the respective pads are determined in this fashion, the layout of the circuit elements on the semiconductor chip is fixed based upon the above macro in step S7. With this layout design, not only is the arrangement of each macro on the semiconductor chip determined, but also the interconnect placement between each macro, between each macro and circuit element, and between these and the input/output terminals are all determined.

For example, the A/D converter is well known as one of the elements that form circuits in semiconductor devices. This A/D converter is comprised of a main body that converts an analog signal into a digital signal, a reference voltage generator that supplies the main body with a reference voltage, and single or multi-channel input circuits that supply an analog signal to the main body. For designing the layout of an A/D converter of this kind, the A/D converter is changed into macro form in a manner such that the main body, the reference voltage generator, and the input/output circuit are placed adjacent to each other and also close to the pads corresponding to this A/D converter. Interconnects among them are then automatically formed.

Afterwards, the connection of this macro to macros related to other circuits forming the semiconductor device performs the arrangement of interconnects throughout the entire semiconductor device and completes the layout design. By completing the layout design in this fashion, the interconnect length and interconnect width are determined, the parasitic resistance and parasitic capacitance to the interconnects are calculated and the performance of the semiconductor device is tested by a simulation device in step S8. Then if there are deficiencies in performance, each of the above design processes are reexamined and design modifications are implemented.

In this type of conventional design of semiconductor device, if deficiencies in the performance of the semiconductor device are found in the results of the performance testing, it is necessary to go back to the process causing the deficiency and reexamine each of the above design processes. If in order to fulfill the delay specifications, the layout related to the other circuits needs to be changed and the layout of the main body of the A/D converter circuit is accordingly changed, then the voltage output from the reference voltage generator changes. Because of this, the size of each resistance inside the reference voltage generator needs to be changed in accordance with the interconnect length in the updated layout. Moreover, the reference voltage generator must be accordingly subjected to a re-layout. Also when the A/D converter is embedded in another product or a semiconductor device, the functional differences among each semiconductor device require differing chip sizes and packages. This results in the output of each design process always including a new design operation for each semiconductor device.

Therefore, in the conventional design of a semiconductor device, the design efficiency is extremely poor. Especially remarkable in recent years is the tendency towards micro-production of various models of semiconductor devices, and in order to meet the demand of a shortened delivery time, it is necessary for the semiconductor design efficiency to be drastically improved. Improving the design efficiency of semiconductor devises is a technical issue that must be solved immediately.

Furthermore, in single-chip microcomputers, etc., an A/D converter is used to take in analog signals, whereas a D/A converter is used to output an analog signal. This type of A/D converter and D/A converter convert analog signals to digital and digital signals to analog, respectively, and are comprised of the reference voltage generator, which assists them in performing signal conversion.

FIG. 2 is a circuit diagram of an example of this kind of reference voltage generator. As shown in this Figure, the reference voltage generator is formed in a manner such that: reference voltage $P_{avref}$ is received from the outside; the resistance ladder comprised of resistance R1, R, . . . R2 is used to divide the voltage between the $P_{avref}$ and $P_{agnd}$; and any one of the partial voltages obtained though this structure (which represent reference voltages for comparison) is supplied to the comparison/conversion circuit through one of the switches. Each reference voltage used for comparison is compared to an analog input signal by the comparison/conversion circuit, thus quantizing the analog input signal.

When a semiconductor device has this type of reference voltage generator, there is a problem with the conventional semiconductor device designing method where the performance of the reference voltage generator differs in each semiconductor device. Namely, because the intervals between adjacent pads on the semiconductor chip are determined by the chip size in the above manner, the placement of the reference voltage generator relative to each pad changes according to chip size. Furthermore, because the region at which the reference voltage generator is arranged upon the semiconductor chip is determined based on the arrangement of other circuits, the distance between the reference voltage generator and the pads differs with each product or each semiconductor device.

This causes the interconnect length between the pad for the reference voltage $P_{avref}$ and the reference voltage generator and also between the pad for the $P_{agnd}$ (analog ground) and the reference voltage generator to differ. Accordingly, the parasitic resistances r1 and r2 differ as shown in FIG. 2 so that the performance of the reference voltage generator corresponds to chip size, or in other words, the said performance differs in each semiconductor device. Therefore, even if the circuit formation and layout of each reference voltage generator are completely identical, each reference voltage for comparison will be different because the above parasitic resistances $r_1$ and $r_2$ are different due to the different chip sizes. Conventionally, this problem with the changes in the parasitic resistances r1 and r2 is solved by adjusting the resistance R1 and/or the resistance R2. So far, the problematic points have been described using the example of an A/D converter, however even in the D/A converters, the phase comparators in PLL circuits, the constant current generating circuits and the like, the same problems develop with layout changes.

For example in the field of mobile communication devices, package (i.e., chip) downsizing and energy efficiency are demanded of core semiconductor devises such as single-chip microcomputers. In order to respond to these demands, there is a countermeasure to further increase the degree of integration in semiconductor chips and to lower the operating voltage. However, when semiconductor chips become highly integrated, noise can easily enter analog circuits from digital circuits, thus the quality of the analog signal deteriorates.

SUMMARY OF THE INVENTION

Taking the above problems into account the present invention has the following objectives:

1. To improve the design efficiency for a semiconductor device.
2. To design a downsized semiconductor device.
3. To design a semiconductor device with high-level integration.
4. To hold down the performance deterioration of analog signals caused by noise from digital circuits.
5. To prevent the reference voltage circuit performance from differing in each semiconductor device made into new products.
6. To prevent the performance of A/D converters and D/A converters from differing in each product or each semiconductor device.

According to an aspect of the present invention, a method of designing a semiconductor device is provided and is comprised of the step of assigning pads ($a_2$ to $a_4$) with their intervals being fixed on a semiconductor chip for a hard macro (A); and laying out the said hard macro (A) on the said semiconductor chip, in conformity with the location of the said pads ($a_2$ to $a_4$); wherein the said hard macro (A) includes layout/interconnect data of a layout-sensitive part (A) of a circuit (A, B) with its corresponding pads ($a_2$ to $a_4$) with their intervals being fixed. An example of this method is illustrated in FIGS. 4, 6, 7, 8 and 10.

According to an aspect of the present invention, a semiconductor device designing apparatus is provided and is comprised of a macro storage unit (2 to 6), which is stored with a hard macro that includes layout/interconnect data of a layout-sensitive part (A) in a circuit (A, B) and corresponding pads ($a_2$ to $a_4$) with their intervals being fixed; and a layout design unit (7, 1000), which lays out the said hard macro, stored in the said macro storage unit, on a semiconductor chip in the manner such that given interval fixed pads on the said semiconductor chip can correspond to the said pads ($a_2$ to $a_4$) in the said hard macro. An example of this apparatus is illustrated in FIGS. 3 and 10.

According to an aspect of the present invention, a memory medium for storing data for access by an application program being executed on a data processing system is provided and is comprised of hard macro data which is stored in the said memory medium and which includes layout/interconnect data of a layout-sensitive part of a circuit with its corresponding pads; wherein the intervals between the said pads are fixed.

BRIEF DESCRIPTION OF DRAWINGS

The above and other objects, features and advantages of the present invention will become more apparent from the following detailed description when taken in conjunction with the accompanying drawings, wherein.

DETAILED DESCRIPTION OF THE PREFERRED EMBODIMENTS

Hereafter, a semiconductor device designing apparatus, its designing method, and a storage medium that is stored with macro information of the said semiconductor device, according to an embodiment of the present invention, will be described with reference to the drawings. In particular, this embodiment of the present invention is used for designing a single-chip microprocessor, more specifically for designing the layout of an A/D (analog to digital) converter.

Figure 1:
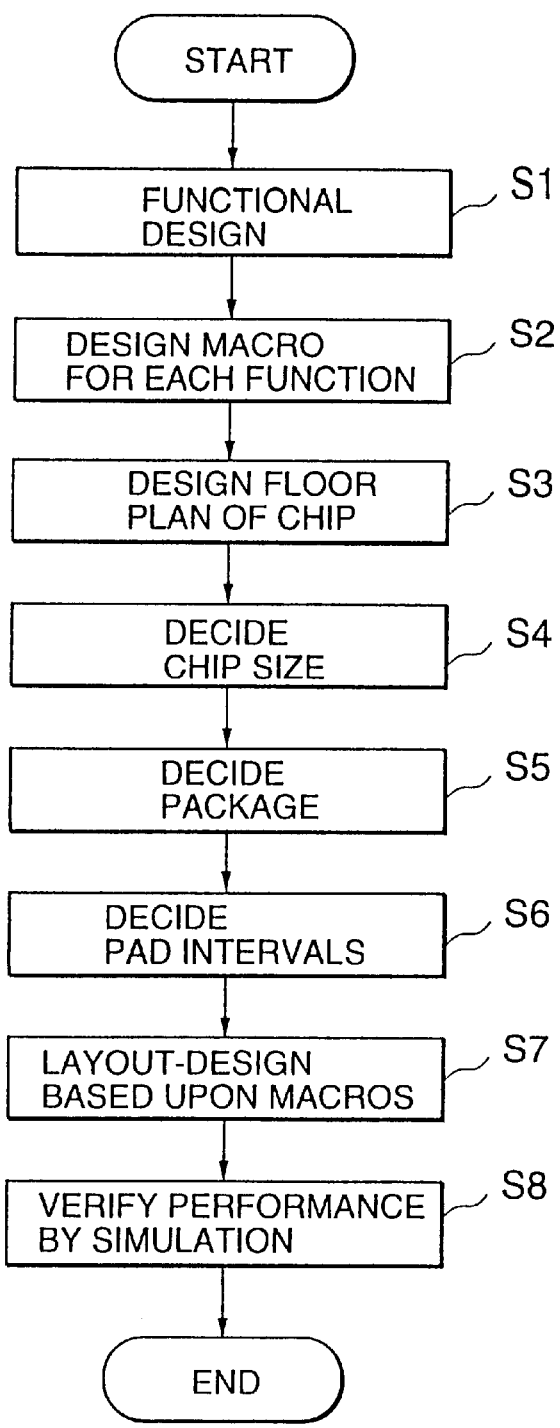
FIG. 1 is a flowchart showing the conventional procedure of designing a semiconductor device.
Figure 2:
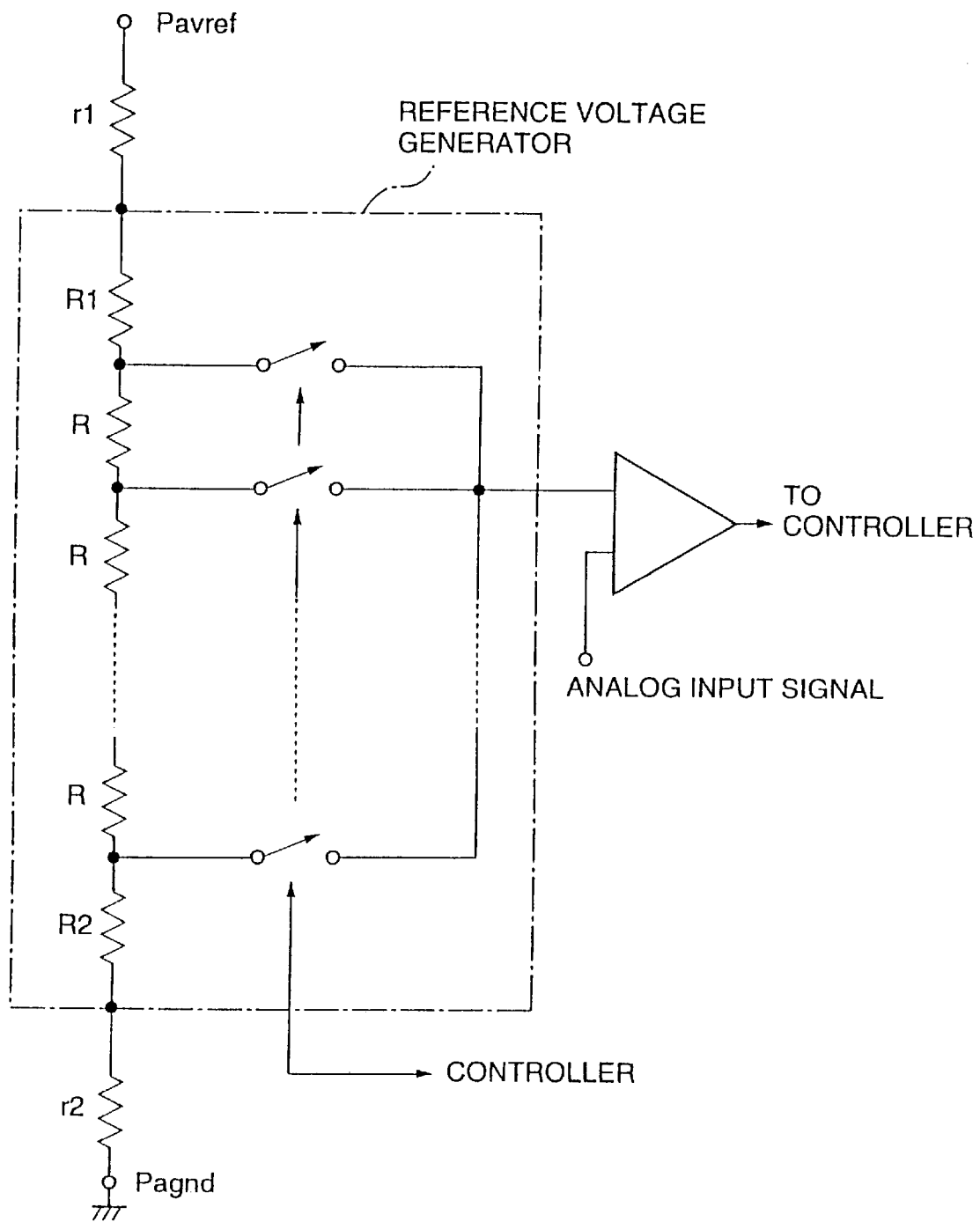
FIG. 2 illustrates the conventional reference voltage generator.
Figure 3:
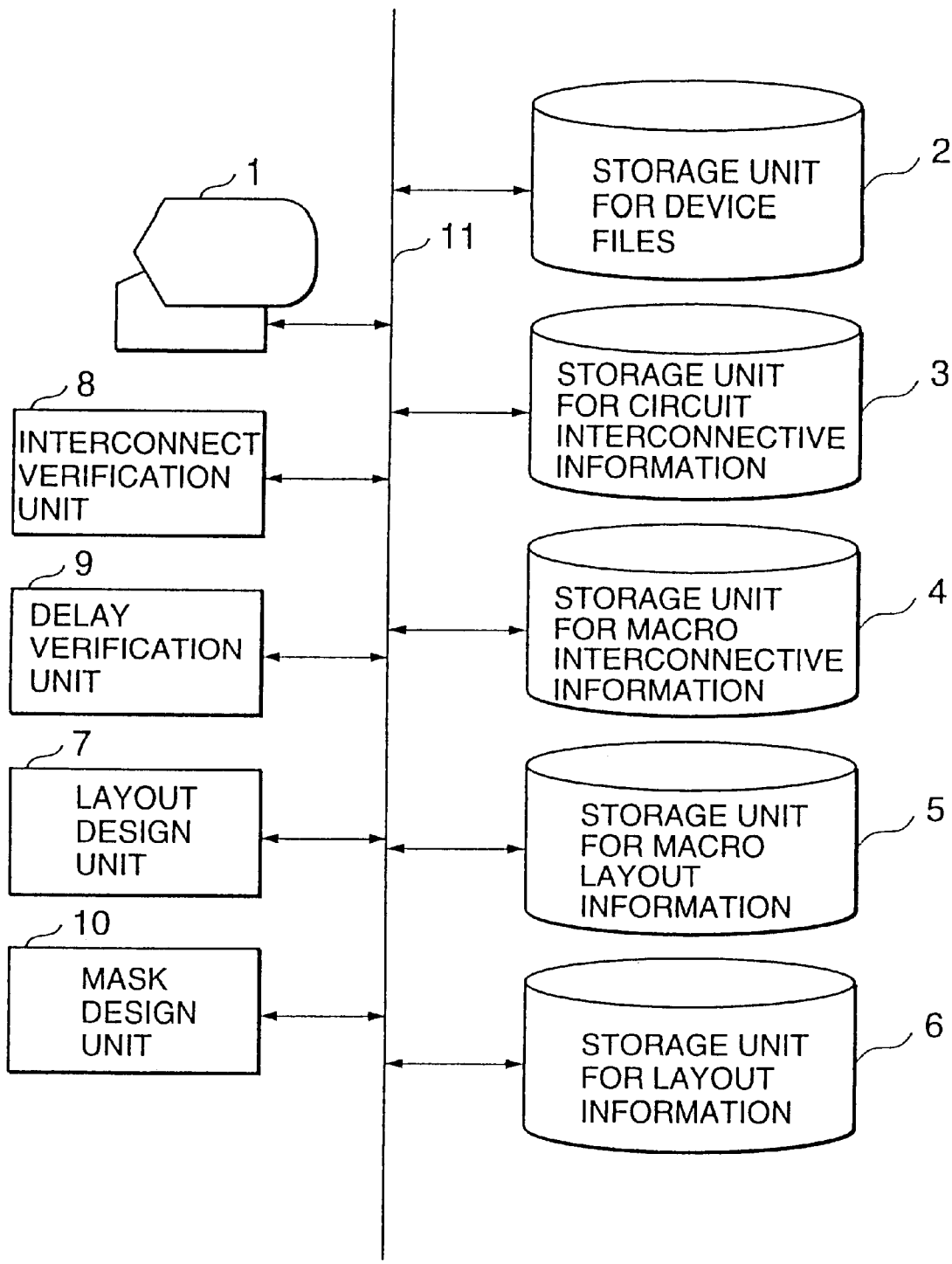
FIG. 3 is a block diagram showing a functional structure of a semiconductor device designing apparatus, according to an embodiment of the present invention.

First, the structure of the designing apparatus, according to an embodiment of the present invention, will be explained. Using this designing apparatus can effectively support the designing of a single-chip microprocessor. FIG. 3 illustrates the functional structure of the designing apparatus. In this Figure, reference numeral 1 denotes a control/display unit; reference numeral 2, storage unit for device files; reference numeral 3, a storage unit for circuit interconnective information; reference numeral 4, a storage unit for macro interconnective information; reference numeral 5, a storage unit for macro layout information; reference numeral 6, a storage unit for layout information; reference numeral 7, a layout design unit; reference numeral 8, an interconnect verification unit; reference numeral 9, a delay verification unit; reference numeral 10, a mask design unit; and reference numeral 11, a bus line. This designing apparatus is functionally structured from each of the above units, but substantially, it is structured by the computer system that loaded each of the programs used for realizing the functions of each of these units. This computer system will be detailed later with reference to FIG. 10.

The control/design unit 1 is used to enter control commands by an operator and to display a variety of information necessary for designing a single-chip microprocessor, and is made up of a keyboard, a pointing device (such as a digitizer or a mouse), a display unit, etc. The device file storage unit 2 is stored with the various specifications of the single-chip microprocessor and the specifications of circuit cells that make up the microprocessor, and is a magnetic disk such as a hard disk.

The circuit interconnective information storage unit 3 is hierarchically stored with information for the circuit cells that make up the single-chip microprocessor and the entire circuit structure of the microprocessor, which will have been provided through the circuit design work that is explained below. More specifically, the storage unit 3 is stored with interconnective information among macros and interconnective information between a macro and external interconnective terminals (i.e., pads). The circuit interconnective information storage unit 3 is, for example, a magnetic disk unit such as a hard disk unit.

The macro interconnective information storage unit 4 is used to store the information of some of the above circuit cells as soft macros. Specifically, it is stored with connective information of some of the above circuit cells, each being described as a soft macro. More specifically, it is stored with functional interconnective information on the soft macro of an input circuit for an A/D converter, which features one of the embodiments of the present invention, and circuit cells that make up the said input circuit. The macro interconnective information storage unit 4 is, for example, a magnetic disk unit such as a hard disk unit.

The macro layout information storage unit 5 is used to store the information of some of the above circuit cells represented by hard macros, which are used for a single-chip microprocessor. Specifically, it is stored with the layout/interconnect information of each hard macro circuit cell. More specifically, it is stored with relative layout information for the hard macro, which is made up of the main body of an A/D converter and a reference voltage generator (i.e., A/D converter hard macro) and which features one of the embodiments of the present invention, and the circuit cells making up the said A/D converter hard macro. The macro layout information storage unit 5 is, for example, a magnetic disk unit such as a hard disk unit.

It is noted that whether a soft macro or a hard macro should be used for each circuit cell is determined based upon a variety of reasons. However, the hard macro is generally and preferably used for a circuit cell with its characteristics such as switching characteristics (e.g., a rise time and a fall time), propagation delay time, reference voltage, etc., being changed based upon the relative locations of the respective circuit elements that make up a circuit cell. On the other hand, the soft macro is generally used for a circuit cell with its characteristics being difficult to modify according to changes in the locations of the circuit elements that make up the circuit cell.

If only using hard macros in the layout of a rectangular-shaped semiconductor chip, the hard macros would not be able to fit in some areas of the semiconductor chip, thereby decreasing the degree of layout freedom and increasing the chip size. However, since the usage of soft macros allows predetermined circuit elements to fit a predetermined region on the semiconductor chip, the chip size will be decreased. Therefore, it is recommended that the hard macros should only be used for the minimum number of circuit elements necessary.

The layout information storage unit 6 is stored with layout information for each circuit element obtained through the single-chip microprocessor designing operation, and is a magnetic disk unit such as a hard disk unit. More specifically, the layout information storage unit 6 is stored with layout information for each circuit element that makes up the semiconductor device, with the layout information being updated at each progress in the single-chip designing operation.

The layout design unit 7 assists in designing the layout of each circuit element in a semiconductor chip depending upon retrieved information from the each of the above-described storage units. The operation of the layout design unit 7 is performed in conformity with the procedure represented by a layout design-assisting program, which is designed so as to lay out each circuit element on the semiconductor chip. The resultant layout information of each circuit element provided by the layout design unit 7 is then stored in the layout information storage unit 6.

The interconnect verification unit 8 verifies the interconnects among each circuit element by comparing them to the interconnective information of the single-chip microprocessor stored in the circuit interconnective information storage unit 3. The operation of the interconnect verification unit 8 is performed in conformity with the procedure of an interconnect verification program. The delay verification unit 9 calculates the parasitic resistance and parasitic capacitance of each interconnect laid out by the layout design unit 7, and then verifies the delay characteristics of the semiconductor chip by comparing them to the respective specifications or references stored in the device file storage unit 2.

The mask design unit 10 assists in designing masks necessary for the fabrication of the semiconductor chip using the layout information of each circuit element in the laid out semiconductor chip. The operation of the mask design unit 10 is performed in conformity with the procedure of a mask design program. Lastly, the bus lines 11 connect the units to each other.

Figure 6:
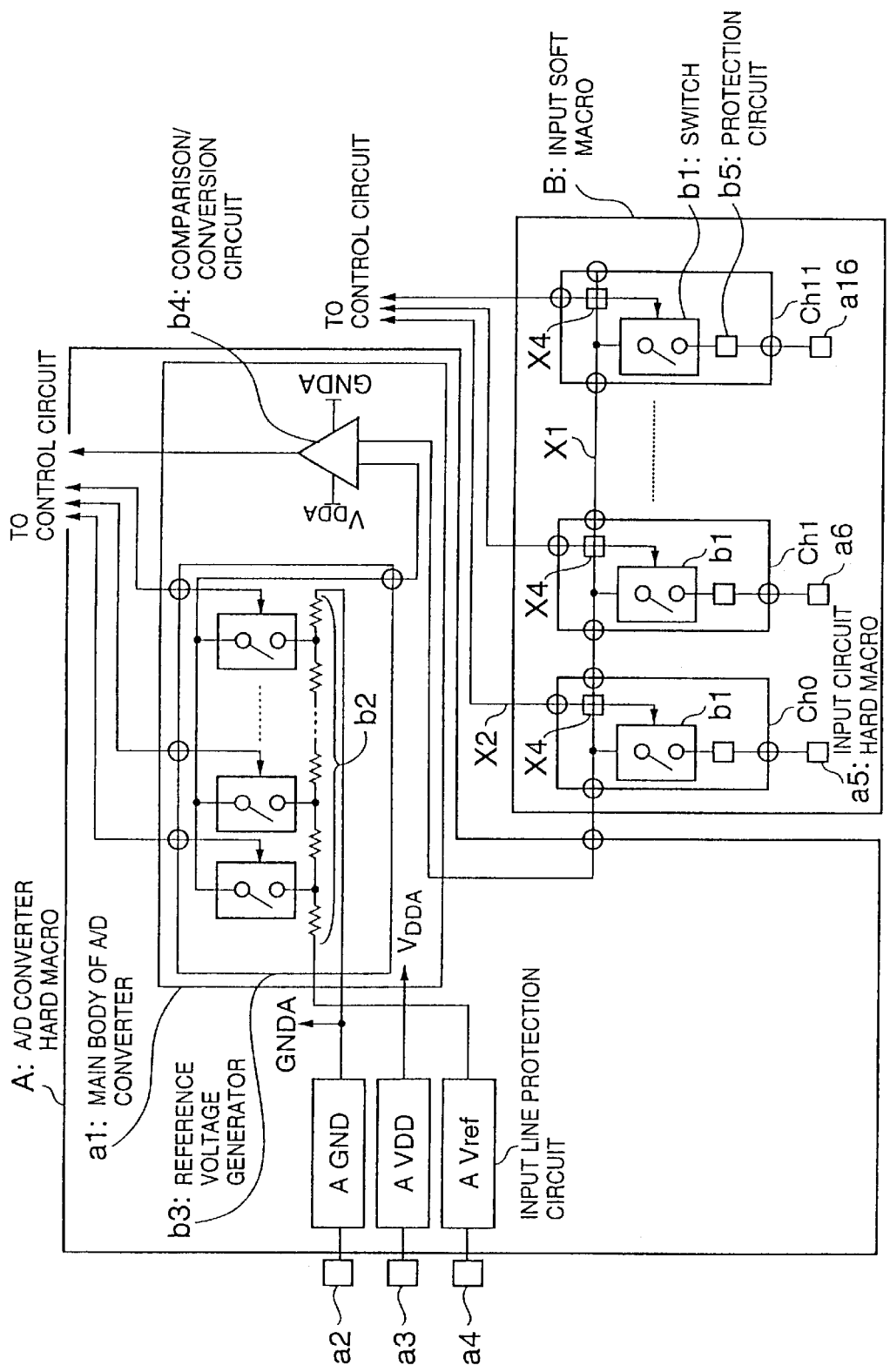
FIG. 6 is a circuit diagram showing a reference voltage generator and input circuits corresponding to the A/D converter hard macro and input soft macro, respectively, according to the present invention.

Next, a method of designing the semiconductor device using the aforementioned designing apparatus will be described in detail. The said designing apparatus features the macro layout information storage unit 5 being stored with information of the hard macros for each input circuit and A/D converter, respectively. It also features the circuit interconnect information storage unit 3 being stored with information of the input soft macro for the group of the input circuits in the A/D converter. The said input circuit hard macro (Ch0 to Ch11), the A/D converter hard macro (A), and the input soft macro (B) for the A/D converter's input circuits will be detailed later with reference to FIG. 6. The information from each hard macro is made up of its horizontal and vertical size; its origin; its name; the arranged direction and relative-to-the-origin address information of each circuit element making up each hard macro; the relative-to-the-origin address information of input/output terminals; interconnective information among circuit elements and among the input/output terminals and the circuit elements; etc. The A/D converter hard macro is comprised of the main body of the A/D converter ($a_1$), the reference voltage generator ($b_3$), input line protection circuits (AGND, AVDD, and AVref), and pads ($a_2$ to $a_4$) as shown in FIG. 6. The input circuit hard macro is comprised of an input line protection circuit, a switch circuit, a magnetic field shielding material, etc. The input soft macro has the interconnective information among the input circuit hard macros (ch0 to ch11) and the interconnective information among the other circuits or input pads ($a_5$ to $a1_6$) and the hard macros.

Figure 4:
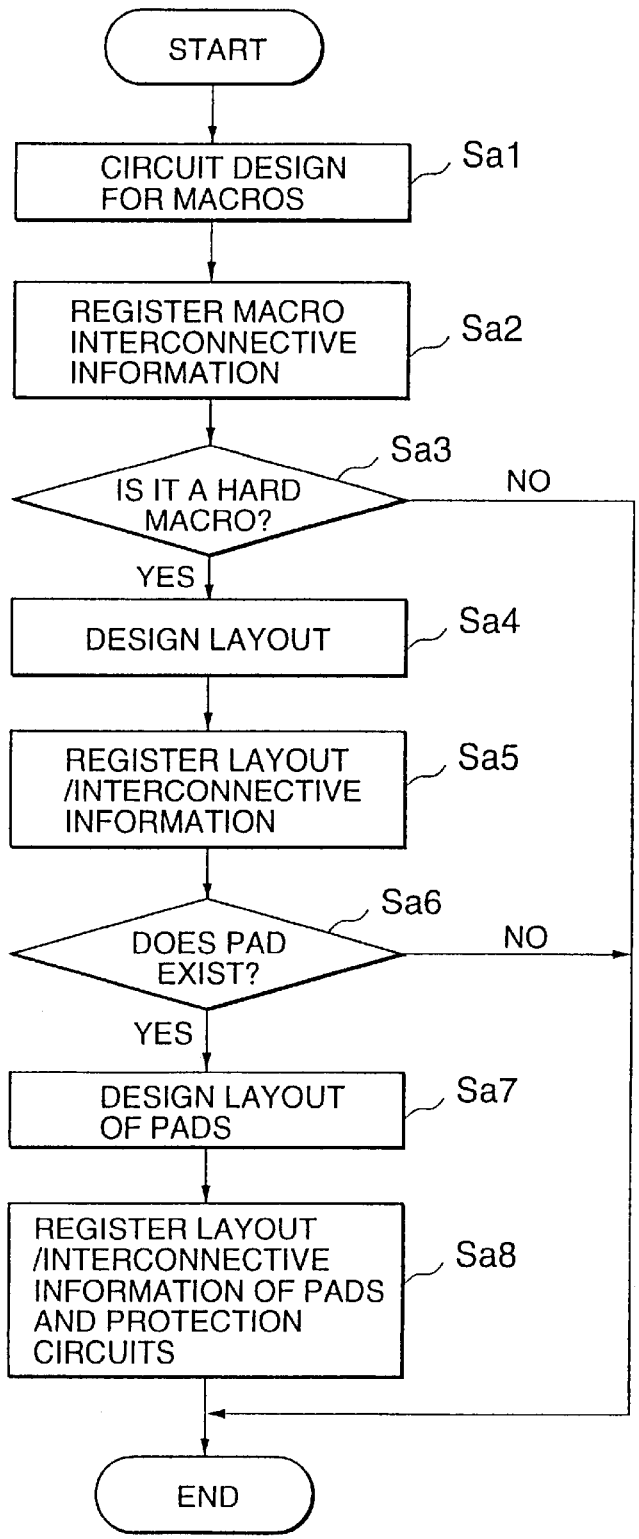
FIG. 4 is a flowchart showing the procedure of designing an A/D converter hard macro and an input soft macro, according to the present invention.

A procedure of designing the aforementioned A/D converter hard macro, the input circuit hard macro, and the input soft macro is described with reference to FIGS. 4 to 6. FIG. 4 is a flowchart illustrating how to design macros, according to this embodiment of the present invention. First, in step Sa1 of FIG. 4, each circuit is designed. Then in step Sa2, the functional interconnective information for the circuit elements that make up each circuit is registered in the macro interconnective information storage unit 4.

In the example of building the A/D converter hard macro (A in FIG. 6), the main body of an A/D converter circuit is designed. The interconnective information of the circuit elements that make up the said main body of the A/D converter circuit is then registered in the storage unit for macro interconnective information 4. In a similar manner, in order to build the input circuit hard macro, a common input circuit, which represents each of the input circuits (Ch0 to Ch11), is designed; and the interconnective information of internal circuit elements that make up the common input circuit is then also registered in the storage unit for macro interconnective information 4. On the other hand, in the case of designing the input soft macro that includes the input circuits (Ch0 to Ch11 in FIG. 6), the entire circuit within the region marked with B is designed using the above-designed common input circuit. The interconnective information among the input circuits (Ch0 to Ch11), which make up the input soft macro, is then registered in the storage unit for macro interconnective information 4.

When the above-designed main body of the A/D converter circuit is designed so that it is built as a hard macro, since the answer of step Sa3 is 'Yes', the layout of the circuit elements that make up the main body of the A/D converter is then designed in step Sa4. In step Sa5, the resultant layout/interconnective information is registered in the macro layout information storage unit 5. In a similar manner, the circuit elements that make up the above-designed input circuit (Ch0 to Ch11) are laid out, and the resulting layout/interconnective information is then registered in the storage unit for macro layout information 5.

In step Sa3, when designing the input soft macro, the answer becomes 'No', the procedure as shown in FIG. 4 is finished.

Afterwards, in the case of designing the hard macro with pads ($a_2$ to $a_4$) as well as the main body of the A/D converter circuit (A), the answer to step Sa6 is 'Yes'. In step Sa7 then, the layout of the pads ($a_2$ to $a_4$) is designed in harmony with the layout of the main body of the A/D converter circuit. In step Sa8, the interconnective information between the said pads and the protection circuits is registered in the macro layout information storage unit 5. The designing of the A/D converter hard macro, the input circuit hard macro, and the input soft macro ends here. If it is unnecessary for the pads to be embedded in the A/D converter hard macro, the answer to step Sa6 becomes 'No'. As a result, the design of the A/D converter hard macro ends without designing the layout of the pads.

Note that the usage of the A/D converter hard macro with pads is allowed for each of differing size semiconductor devices with several fixed address pads for the reference voltage generator and/or with the A/D converter.

The said semiconductor devices with several fixed address pads, which are prepared at their corners regardless of chip size, are provided so as to facilitate the process step of resin injecting/sealing. In more detail, each of the resin sealed-type semiconductor devices is completed by mounting a semiconductor chip onto a lead frame, wire-bonding, pinching the semiconductor chip mounted lead frame between molding dies, and injecting and sealing resin between the molding dies. Since resin is ordinarily injected at the corner of each semiconductor chip, interval pads that are too short at the corner hinder the injection of resin. Also, interval pads that are too long at the corner cause the flow of resin application to stress the bonding wires, thus bringing about a bonding defect. To solve this problem, the intervals between adjacent pads at the corner are ordinarily set to be the same length or the same optimal lengths for differing size packages. Considering this feature, a hard macro including both the main body of the A/D converter circuit and its corresponding fixed address pads, according to the present invention, is provided.

Figure 5:
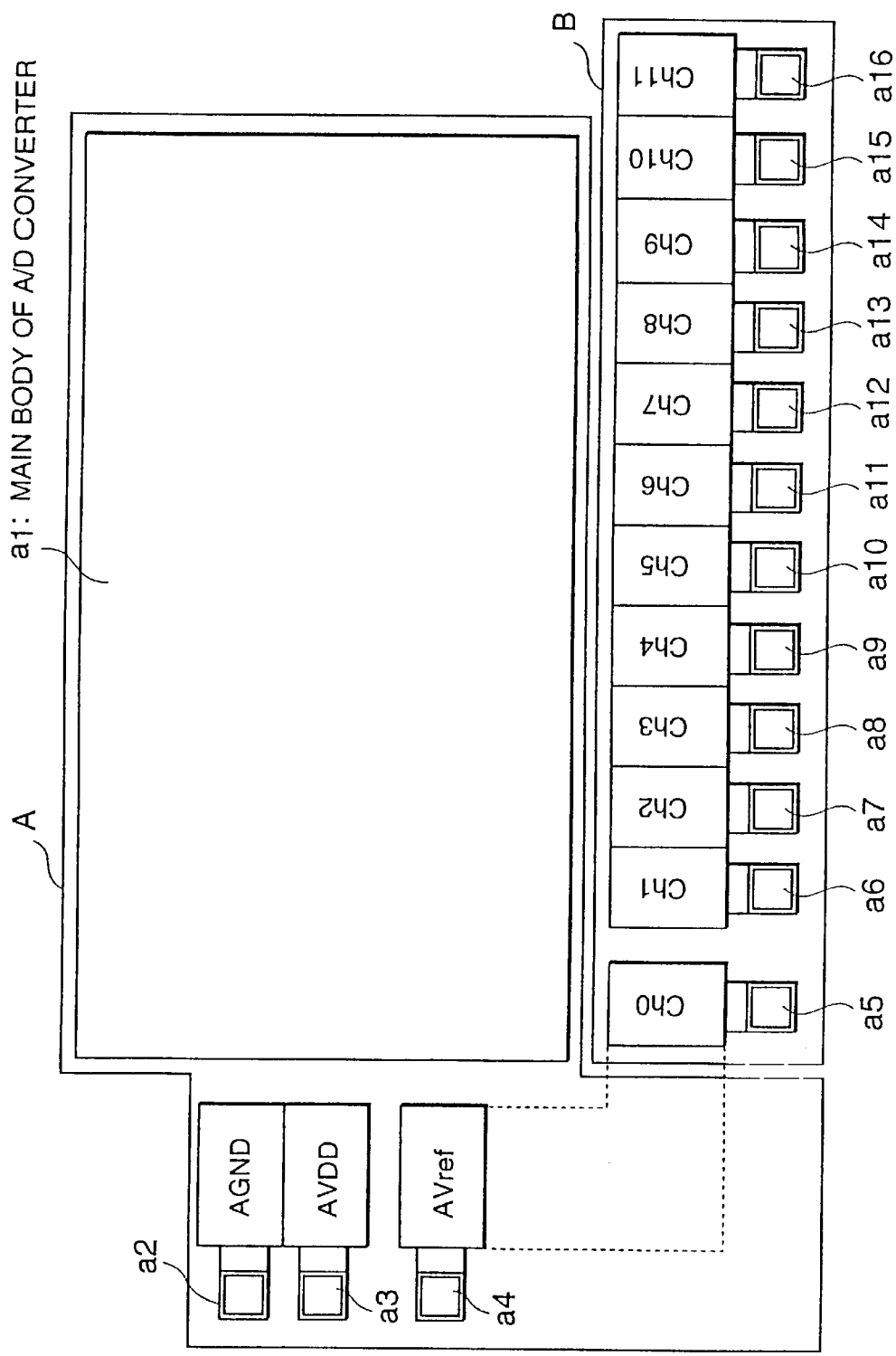
FIG. 5 is an aerial view showing a floor plan of the A/D converter hard macro, according to the embodiment of the present invention.

FIG. 5 is an aerial view illustrating the layout of the A/D converter hard macro, according to the present invention; whereas FIG. 6 illustrates an example of its detailed circuit. In FIGS. 5 and 6, reference numeral A denotes the A/D converter hard macro on the semiconductor chip; reference numeral $a_1$, the main body of the A/D converter; reference numerals $a_2$ to $a_4$, fixed interval/fixed address pads for the main body of the A/D converter; reference numerals $a_5$ to $a_{16}$, unfixed interval/unfixed address pads for the other parts of the A/D converter; reference numeral AGND, an analog ground line protection circuit; reference numeral AVDD, an analog power supply line protection circuit; reference numeral AVref, an analog reference voltage line protection circuit; and reference numerals Ch0 to Ch11, input circuits for input analog signals.

The pad $a_2$ is used to connect the ground line of the analog circuit in the main body of the A/D converter $a_1$ to an external analog ground (not shown in the Figure); the pad $a_3$ is used to supply an analog electric power to the analog circuit in the main body $a_1$ from the outside; and the pad $a_4$ is used to provide the reference voltage generator in the main body $a_1$ with a reference voltage.

The pads $a_5$ to $a_{16}$ are used for the main body of the A/D converter $a_1$ to receive analog input signals from the outside. The pads $a_5$ to $a_{16}$ and input circuits Ch0 to Ch11 placed within the input soft macro region B are arranged on the semiconductor chip using the aforementioned soft macro.

The basic structure of A/D converters is well known. However, the A/D converter, according to this embodiment, has an additional function of selecting one of twelve channels of analog input signals, which have entered the pads $a_5$ to $a_{16}$ from the outside, and then quantizing it. As shown in FIG. 6, the A/D converter is comprised of switches $b_1$, which select one of the analog input signals; reference voltage generator $b_3$, which generates reference voltages for comparison by the resistor ladder $b_2$; and comparison/conversion circuit $b_4$, which compares the selected analog input signal to each of the reference voltages, and thus quantizes the signal.

The main body of the A/D converter $a_1$ is comprised of the reference voltage generator $b_3$ $_{and}$ the comparison/conversion circuit $b_4$. The ground line of the reference voltage generator $b_3$ and comparison/conversion circuit $b_4$ is connected to an external analog ground (not shown in the Figure) via the input line protection circuit AGND and pad $a_2$; whereas an analog electric power is supplied to the reference voltage generator $b_3$ and comparison/conversion circuit $b_4$ via the pad $a_3$ and input line protection circuit AVDD. The reference voltage generator $b_3$ is supplied with a reference voltage (AVref) via the pad $a_4$. The reference voltage supplied is divided by the series of resistors (i.e., resistor ladder) $b_2$ in the reference voltage generator $b_3$, thus providing desired reference voltages for comparison.

The structure of the analog ground line protect circuit AGND, the analog power supply line protection circuit AVDD, and the reference voltage line protection circuit AVref is made up of a diode, etc., and is well known. They are used to protect the internal circuits against the possible application of abnormal voltage. The input circuits Ch0 to Ch11 are each made up of a switch $b_1$ and protection circuit $b_5$. Each input circuit selects one of the analog input signals supplied via the pads $a_5$ to $a_{16}$, in conformity with control signals provided by a control circuit (not shown in the Figure) prepared outside the A/D converter, and then outputs the selected signal to the main body of the A/D converter $a_1$.

As described before, the pads $a_2$ to $a_4$ are laid out at the corner of a semiconductor chip. According to this embodiment of the present invention, the pad $a_2$ is used for the analog ground; the pad $a_3$, the analog power supply; the pad $a_4$, the reference voltage; and the pads $a_5$ to $a_{16}$, the respective channels of analog input signals. In the A/D converter hard macro, the pads $a_2$ to $a_4$, the main body of the A/D converter $a_1$, the analog ground line protection circuit AGND, the analog power line protection circuit AVDD, and the reference voltage line protection circuit AVref are all laid out. In the following description, the collective structure of the above circuits, defined by the A/D converter hard macro, is called 'A/D core'.

Since the structures of input circuits Ch0 to Ch11 are all the same, the aforementioned input soft macro is designed and comprised of interconnective information for each input circuit hard macro, with its layout/interconnection information being stored in the macro layout information storage unit 5. The input soft macro can be laid out in accordance with necessary number of input circuits and the addresses of the pads.

Next, the procedure of designing a semiconductor device or a single-chip microprocessor using the A/D converter hard macro and input soft macro, which are designed in advance, is explained with reference to FIG. 7.

First, instep Sb1, all circuits that can satisfy the given technical specifications of the single-chip microprocessor are designed and registered in the circuit interconnective information storage unit 3. This circuits designing work is done while referring each specification stored in the device file storage unit 2, in conformity with a command given by an operator through the control/display unit 1. Each circuit element, which is stored in, for example, the circuit interconnective information storage unit 3, and which satisfies the above specifications, is selected. Each circuit element selected is then interconnected to one another, thus completing the design of the single-chip microprocessor.

Afterwards, in step Sb2, the operator manipulates the control/display unit 1 so that a macro (a soft macro or a hard macro) corresponding to each circuit element that makes up the single-chip microprocessor can be retrieved from either the macro interconnective information storage unit 4 or the macro layout information storage unit 5. In step Sb3, the floor plan of the microprocessor is roughly designed. Specifically, the hard macro for each designed circuit element with its layout being decided is roughly arranged in place; whereas the approximate area of the soft macro is estimated from the sizes of the hard macros that the soft macro includes, and therewith the soft macro is roughly arranged in place.

In step Sb4, breaking down the floor plan, the operator estimates the size of the semiconductor chip. In step Sb5, the package and the intervals between adjacent pads suitable for the estimated chip size are decided. In step Sb6, the macros, with their addresses dependent upon the above floor plan, are connected to one another through the assistance of an interconnect tool. In step Sb7, the resultant interconnects are verified by the interconnect verification unit 8. Specifically, the verification is performed by comparing the entire group of circuits in the single-chip microprocessor, structured by the assistance of the interconnect tool, to the entire group of circuits designed in step Sb1 and which have been stored in the circuit interconnective information storage unit 3. If this verification shows there is no defect (in step Sb8), the operation in step Sb9 is performed. Otherwise, if there is a defect, then the operation in step Sb6 is again repeated. This repetition continues so as to correct the found interconnective defect until the answer to step Sb8 is becomes 'Yes'; namely until there is no interconnective defect.

Figure 8:
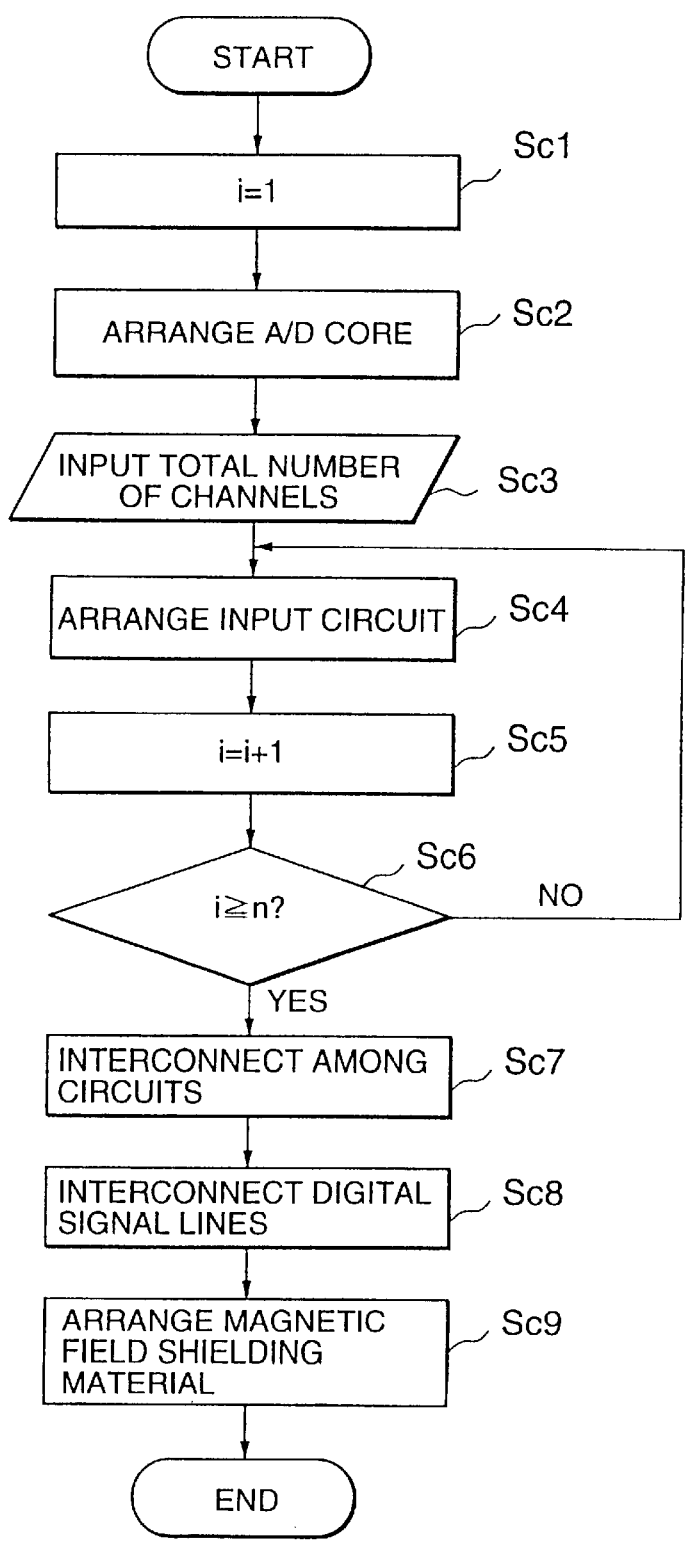
FIG. 8 is a flowchart showing a procedure of designing the layout of the input circuits, according to the present invention.

In step Sb9, the final arrangement of hard macros, which have been roughly laid out based upon the above floor plan, is made. Besides, the layout of each circuit element relevant to each soft macro is precisely fixed. FIG. 8 illustrates the detailed procedure of designing the layout of the A/D converter in the microprocessor, according to the embodiment of the present invention. First, in step Sc1, the layout design unit 7 initializes variable i, which represents the number of channels for analog input signals, into 0.

In step Sc2, the A/D converter hard macro is selected and designated through the control/display unit 1. Also, the pads $a_2$ to $a_4$ are designated so as to arrange the A/D converter core made up of the pads $a_2$ to $a_5$, the main body of the A/D converter $a_1$, the analog ground line protection circuit AGND, the analog power supply line protection circuit AVDD, and the reference voltage line protection circuit AVref. These all are arranged at a given area of the corner in the semiconductor chip, as shown in FIG. 5.

After the A/D core has been laid out, the input circuits Ch0 to Ch11, represented by the input soft macro, are laid out in the increasing order of variable i. In order to do this, in step Sc3, the total number of channels or input circuits n is input via the control/display unit 1. As shown in FIG. 5, since the A/D converter is made up of, for example, twelve input channels, the data of twelve is given for the total number of channels via the control/display unit 1. It is noted that this total number can be read out from the device file storage unit 2.

In step Sc4, the layout design unit 7 arranges the input circuit Ch0 in vicinity of the pad $a_5$. In step Sc5, the variable i is increased by one. In step Sc6, it is determined whether or not the variable i is equal to or greater than the total number n. If 'No', the operations in the steps Sc4 and Sc5 are repeated until the step Sc6 gives 'Yes'. If 'Yes', the layout of all the input circuits Ch0 to Ch11 has been completed. The input terminal of each input hard macro or each input circuit Chx is arranged to be very close to its corresponding pad so that each to-be-formed interconnect will not be bent. Therefore, the chip area can be decreased.

This layout procedure for the input circuits Ch0 to Ch11 arranges the pads $a_5$ to $a_{16}$ in line at the periphery of the semiconductor chip, with each of the said pads $a_5$ to $a_{16}$ corresponding to the variable i updated in step Sc5. The procedure also arranges the input circuits Ch0 to Ch11 at the region very close to the respective pads $a_5$ to $a_{16}$. All the necessary circuit elements for the A/D converter have been arranged on top of the semiconductor chip through the above-mentioned procedure. Incidentally, FIG. 5 illustrates the case of the pads being arranged at uniform intervals. However, certain irregular intervals are also allowed for the arrangement of the pads.

Note that since there are stronger demands for downsizing the package size of the single-chip microprocessors than that of the ASICs, the degree of integration in each semiconductor chip needs to be improved. This degree of integration can be improved by arranging the input circuits Ch0 to Ch11 at the region very close to the respective pads $a_5$ to $a_{16}$, which have been arranged at the periphery of the semiconductor chip. This allows the region between pads $a_5$ to $a_{16}$ and input circuits Ch0 to Ch11 to be exploitable.

After all the circuit elements have been arranged, the output terminals of the input circuits Ch0 to Ch11 are connected to one another via an analog output signal line X1, and connected to the input terminal of the A/D core (see FIG. 6) in step Sc7. In step Sc8, digital signal lines X2 that control the switches in the input circuits Ch0 to Ch11 are connected to the control terminals of the switches, respectively (see FIG. 6). In step Sc9, a magnetic field shielding material is arranged at each of the intersections X4 of the digital signal lines and the analog output signal line X1, and the design of the A/D converter layout is completed.

Figure 9:
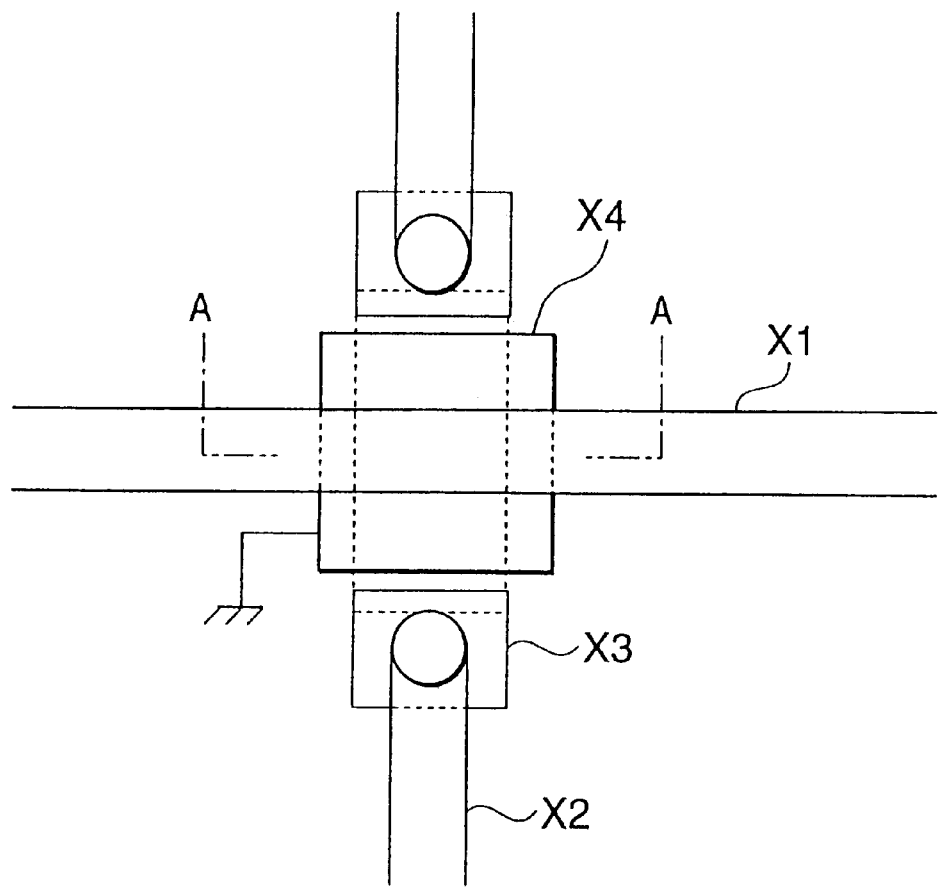
FIGS. 9(a) and 9(b) are an aerial view and cross section showing the structure of a piece of magnetic field shielding material, according to the present invention.
Figure 9:
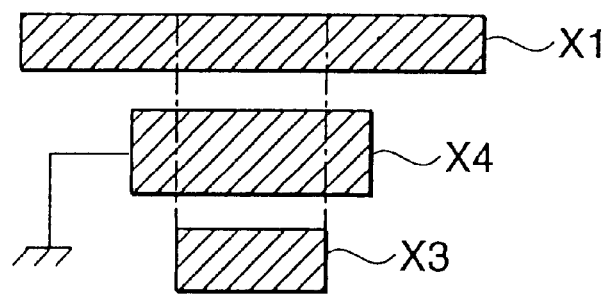

FIGS. 9(a) and 9(b) illustrate an enlarged aerial view and cross section, respectively, of the magnetic field shielding material. The cross section of FIG. 9(b) is obtained by cutting along the line AA in FIG. 9(a). As shown in FIGS. 9(a) and 9(b), at the intersection of analog line X1 and digital line X2, digital line X2 is formed so as to create a multi-level intersection with analog line X1 via connecting line X3. A magnetic field shielding material X4 is sandwiched between the analog line X1 and the connecting line X3.

The multiple pieces of magnetic field shielding material X4 are grounded so as to effectively shield. This material X4 is made of, for example, aluminum, which is the same material as ordinary interconnects. The insertion of the multiple pieces of magnetic field shielding material X4 prevents the magnetic fields caused by wide variations in the amplitude of digital signal flowing through the digital signal lines X2, from adversely affecting the small-amplitude analog signals flowing though the analog output signal line X1. As a result, a possible deterioration of the S/N ratio in the analog signals is prevented.

If the input circuits Ch0 to Ch11 were registered as a soft macro, it would be impossible to form the aforementioned multiple pieces of magnetic field shielding material by any automatic layout/interconnect process. However, registering the circuit made up of the input circuits Ch0 to Ch11 as a hard macro allows an arrangement of the multiple pieces of magnetic field shielding material X4, which have a given shape, at desired regions, thus lowering the noise level of the analog signals.

Furthermore, since the analog signal line X1 can be formed in advance, so as for it to cross the input hard macros (i.e., input circuits Ch0 to Ch11), the length of analog signal line X1, which runs among the input circuits, can be kept to a minimum. This allows the formation of high performance input circuits with interconnect resistances controlled to a minimum and a greatly reduced possibility of noise interference.

The designing of the A/D converter layout is completed through the aforementioned procedure. In a similar manner, the layout of another circuit that makes up the single-chip microprocessor can be designed using a variety of soft macros, which are stored in the macro interconnective information storage unit 4, and a variety of hard macros, which are stored in the macro layout information storage unit 5.

Figure 7:
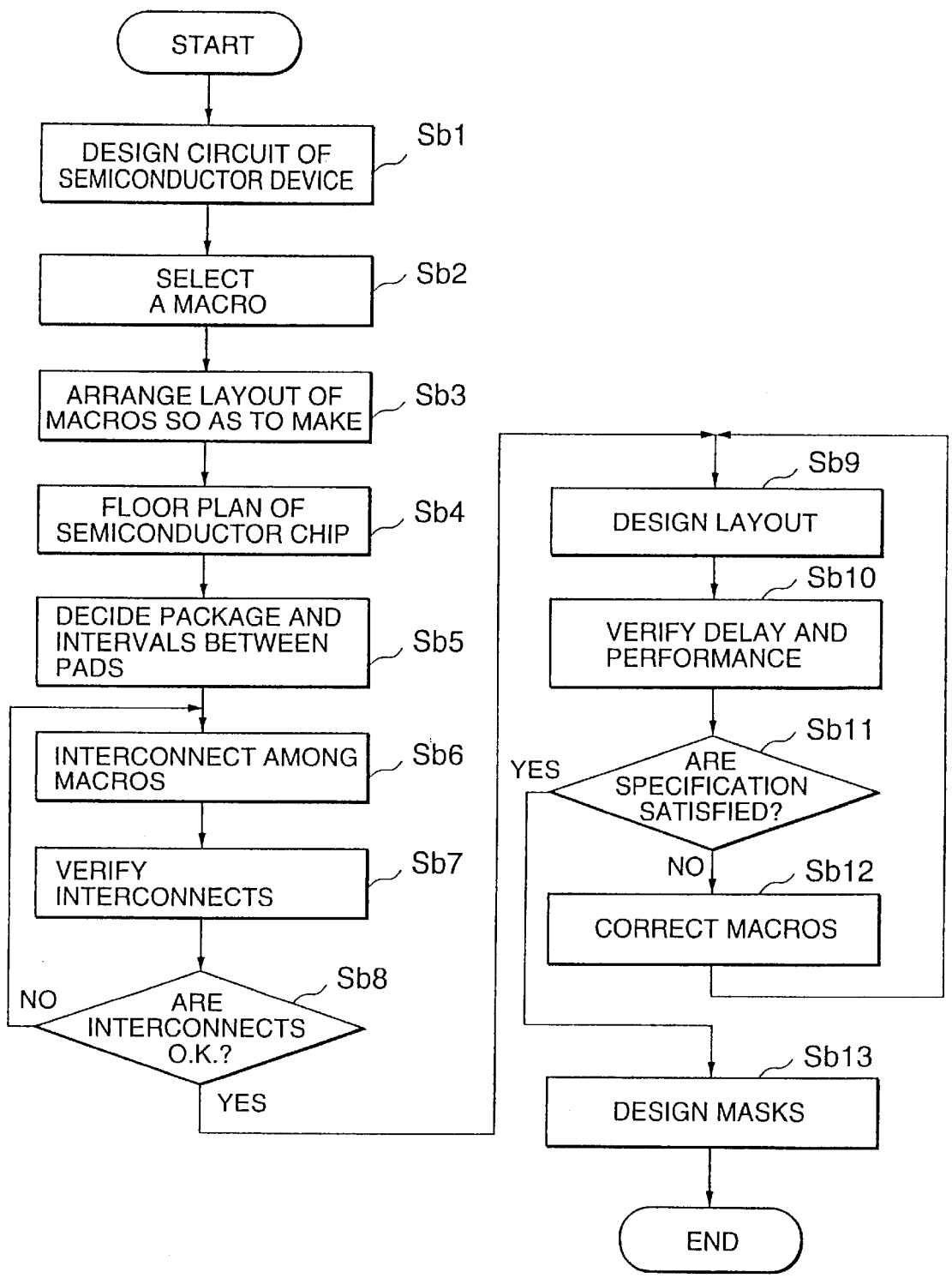
FIG. 7 is a flowchart showing an entire procedure of designing a semiconductor device, according to the present invention.

When the layout of all circuit elements making up the single-chip microprocessor have been decided in a manner similar to that of the A/D core, delay performance is then verified in step Sb10 of FIG. 7. This verification is performed by the delay verification unit 9, which simulates an expected amount of delays along each interconnect that connects one circuit element to the other, and which then determines whether desired specifications of the microprocessor are satisfied in step Sb11. If the answer to step Sb11 is 'No', the corresponding macro is corrected so that the amount of delay can satisfy the above specifications in step Sb12. The layout of the macro is then changed in accordance with the correction of the macro in step Sb9. Otherwise, if the answer to step Sb11 is 'Yes', since the amount of delay has satisfied the specifications, the mask design unit 10 designs masks for the single-chip microprocessor depending upon the latest layout design information in step Sb13; thus completing the entire design procedure for the single-chip microprocessor. Afterwards, the masks provided by the mask design unit 10 are used to manufacture semiconductor chips for the single-chip microprocessor.

In the above description, the case of designing a single-chip microprocessor with an A/D converter has been explained. However, the present invention is not limited to this. The present invention can also be used to implement analog circuits, such as a PLL circuit, a constant-current source, and a D/A converter, in a semiconductor device. In the case of a PLL circuit, a hard macro made up of layout-sensitive parts in the PLL circuit, such as the VCO circuit and loop filter, the power supply lines for them, and the pads for the power supply lines, is provided in a manner similar to the A/D core, according to the present invention. In the case of the constant-current source, a hard macro with both pads for the power supply lines and the core of the constant-current source is provided.

Further, in the above description, the case of the magnetic field shielding material X4 being arranged at the intersection of analog line X1 and digital line X2 is explained. However, the magnetic field shielding material X4 is also allowed to be arranged at the area where analog line X1 runs near digital line X2.

Furthermore, the storage units 2 to 6, which are stored with interconnect/layout information, as shown in FIG. 3 denote any kind of recording media that can temporally or eternally record the interconnect/layout information of a semiconductor device, namely, a portable or movable recording media such as magnetic tape, magnetic disk, or optical disk, or a computer system embedded one such as a semiconductor memory device or a hard disk.

Figure 10:
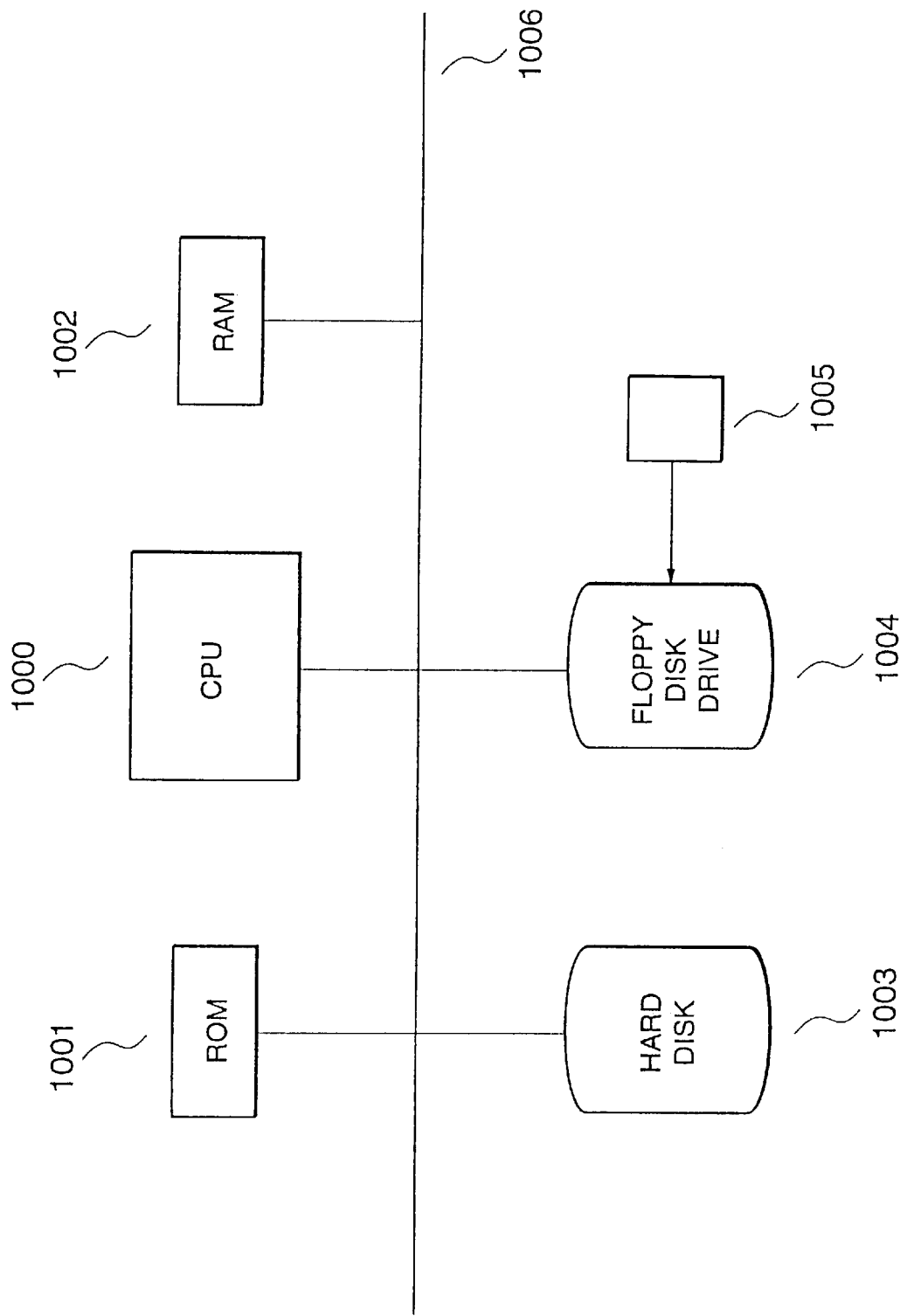
FIG. 10 illustrates an example of a computer system that executes operations identical to those in the system in FIG. 3, according to the present invention.

Next, an example of a computer hardware structure that performs the operations in the system of FIG. 3, according to the present invention will be detailed while referencing FIG. 10. In FIG. 10, the computer system is made up of CPU 1000, ROM 1001, RAM 1002, hard disk 1003, floppy disk drive 1004, bus lines 1006 that communicate commands/data among them, and a floppy disk that is stored with interconnect/layout information of the aforementioned hard macros, such as the A/D core, and soft macro, such as the input soft macro, according to the present invention. The CPU 1000 reads out specific software programs from, for example, either the ROM 1001 or the hard disk 1003, interprets it, and executes accordingly. The RAM is used as a working area, which is stored with, for example, the values of variables defined in the software programs.

The operations of the interconnect verification unit 8, the delay verification unit 9, the layout design unit 7, and the mask design unit 10 in FIG. 3 can all be performed by the assistance of specific software programs, which represent the procedures of executing the respective operations. These software programs are stored in either the ROM 1001 or the hard disk shown in FIG. 10. The information identical to that stored in the storage units 2 to 6 in FIG. 3 is stored in the hard disk 1003 in FIG. 10. It is apparent from this computer hardware structure that operations identical to those of units 8 to 10 in FIG. 3 can be executed by the computer system in FIG. 10.

A semiconductor device designing method and apparatus as well as memory media stored with macro information, according to the present invention, have been described in connection with several preferred embodiments. It is to be understood that the subject matter encompassed by the present invention is not limited to that specified embodiment. On the contrary, it is intended to include as many alternatives, modifications, and equivalents as can be included within the spirit and scope of the following claims.

What is claimed is:

1. A method of designing a semiconductor device by laying out a plurality of macro cells on a semiconductor chip, said semiconductor chip having a plurality of chip pads each being used to perform at least one of signal receiving and signal outputting functions with respect to an outside of said semiconductor chip, comprising:

a fit group of chip pads, an interval of adjacent ones of which is varied in accordance with at least one of a size of the semiconductor chip and macro cells to be laid out on the semiconductor chip, and second group of chip pads, an interval of adjacent ones of which is substantially fixed irrespective of the size of the semiconductor chip and the macro cells to be laid out on the semiconductor chip, making up at least one of said macro cells as a hard macro comprising a plurality of circuit elements and at least two macro pads for signal transfer, said bard macro thereby including first layout and interconnective information among said circuit elements and second layout and interconnective information between said at least two macro pads and said circuit elements, and allocating at least two of said second group of chip pads to said at least two macro pads of said hard macro.

2. The method as claimed in claim 1, wherein said semiconductor chip is rectangular in shape to have four corners, and said second group of chip pads being disposed at one of said corners of said semiconductor chip.

3. The method as claimed in claim 1, wherein said circuit elements constitute a reference voltage generator having first and second terminals supplied with a voltage therebetween and said first and second terminals being defined as said macro pads.

4. The method as claimed in claim 3, wherein said reference voltage generator is used for an analog-digital converter.

5. The method as claimed in claim 1, further comprising:

laying out circuit elements other than said circuit elements of said hard macro, and forming, when an analog signal line for an analog signal intersects a digital signal line for a digital signal, a magnetic field shielding material at a point where said analog signal line intersects said digital signal line.

6. An apparatus for designing a semiconductor device by laying out a plurality of macro cells on a semiconductor chip, said semiconductor chip having a plurality of chip pads each being used to perform at least one of signal receiving and signal outputting functions with respect to an outside of said semiconductor chip, comprising:

a first group of chip pads, an interval of adjacent ones of which is varied in accordance with at least one of a size of the semiconductor chip and macro cells to be laid out on the semiconductor chip, and second group of chip pads, an interval of adjacent ones of which is substantially fixed irrespective of the size of the semiconductor chip and the macro cells to be laid out on the semiconductor chip, a macro storage unit having at least one of said macro cells as a hard macro comprising a plurality of circuit element and at least two macro pads for signal transfer, said hard macro thereby including first layout and interconnective information among said circuit elements and second layout and interconnective information between said at least two macro pads and said circuit elements, and a layout design unit allocating at least two of said second group of chip pads to said at least two macro pads of said hard macro.

7. The apparatus as claimed in claim 6, wherein said semiconductor chip is rectangular in shape to have four corners and said second group of chip pads being disposed at one of said corners of said semiconductor chip.

8. The apparatus as claimed in claim 6, wherein said circuit elements constitute a reference voltage generator having first and second terminals supplied with a voltage therebetween and said first and second terminals being defined as said macro pads.

9. The apparatus as claimed in claim 8, wherein said reference voltage generator is used for an analog-digital converter.

10. The apparatus as claimed in claim 6, wherein said layout design unit lays out circuit elements other than said circuit elements of said hard macro and forms, when an analog signal line for an analog signal intersect with a digital signal line for a digital signal, a magnetic field shielding material at a point where said analog signal line intersects said digital signal line.

11. A memory medium containing data for access by an application program being executed on a data processing system, comprising:

data of a plurality of macro cells; and data of a semiconductor chip having a plurality of chip pads each being used to perform at least one of signal receiving and signal outputting functions with respect to an outside of said semiconductor chip, said chip pads comprising a first group of chip pads, an interval of adjacent ones of which is varied in accordance with at least one of a size of the semiconductor chip and macro cells to be laid out on the semiconductor chip, and a second group of chip pads, an interval of adjacent ones of which is substantially fixed irrespective of the size of the semiconductor chip and the macro cells to be laid out on the semiconductor chip;

wherein at least one of said macro cells comprises a plurality of circuit elements and at least two macro pads for signal transfer, said hard macro thereby includes first layout and interconnective information among said circuit elements and second layout and interconnective information between said at least two macro pads and said circuit elements, said at least two of said second group of chip pads are arranged to said at least two macro pads of said hard macro.

12. The memory medium as claimed in claim 11, wherein said semiconductor chip is rectangular in shape to have four corners and said second group of chip pads is disposed at one of said corners of said semiconductor chip.

13. The memory medium as claimed in claim 11, wherein said circuit elements constitute a reference voltage generator having first and second terminals supplied with a voltage therebetween and said first and second terminals are defined as said macro pads.

14. The memory medium as claimed in claim 13, wherein said references voltage generator is used for an analog-digital converter.

15. The memory medium as claimed in claim 11, further comprising:

data of magnetic field shielding material to be arranged at a point where a signal line for analog signal and a digital signal line for a digital signal intersect.

* * * * *